United States Patent

Chen

[11] Patent Number: 5,942,728
[45] Date of Patent: Aug. 24, 1999

[54] WATERPROOF CASE

[75] Inventor: Tseng-Ming Chen, Hsinchu, Taiwan

[73] Assignee: Weltek Electronics Co., Ltd., Taipei, Taiwan

[21] Appl. No.: 08/985,522

[22] Filed: Dec. 5, 1997

[30] Foreign Application Priority Data

Sep. 10, 1997 [TW] Taiwan ................................. 86217175

[51] Int. Cl.$^6$ ................................................ H02G 3/18
[52] U.S. Cl. ........................ 174/65 R; 174/255; 361/752
[58] Field of Search .................... 174/255, 52.1, 174/65 R, 17 CT; 361/752, 756, 759, 732, 740, 814; 200/302.2; 220/3.8

[56] References Cited

U.S. PATENT DOCUMENTS

| | | | |
|---|---|---|---|
| 3,089,009 | 5/1963 | Korsgren, Sr. | 200/302.2 X |
| 3,392,228 | 7/1968 | Zerwes | 174/52.1 |
| 3,585,273 | 6/1971 | Paul | 174/65 R |
| 4,295,179 | 10/1981 | Read | 174/52.1 X |
| 4,699,293 | 10/1987 | Duchrow | 220/3.8 X |
| 4,791,717 | 12/1988 | Hemmie | 174/52.1 X |
| 4,896,784 | 1/1990 | Heath | 174/65 R X |
| 5,600,543 | 2/1997 | Sanemitsu | 361/752 X |
| 5,844,781 | 12/1998 | Schlotterer et al. | 174/52.1 X |

FOREIGN PATENT DOCUMENTS

| | | |
|---|---|---|
| 243794 | 3/1995 | Taiwan . |
| 290019 | 11/1996 | Taiwan . |

Primary Examiner—Dean A. Reichard
Attorney, Agent, or Firm—Smith, Gambrell & Russell, LLP; Beveridge, DeGrandi, Weilacher & Young; Intellectual Property Group

[57] ABSTRACT

A waterproof case for receiving a circuit board includes a housing, a cover and a waterproof washer. The inner edge of the opening end of the housing is formed into a slant inner edge, and a closed end of the housing is provided with supporting members for supporting the circuit board. The cover is attached to the opening end of the housing, and has an annular flange for mounting the waterproof washer, mounting members for mounting the circuit board, and a through hole for wires. When fixing the cover onto the housing by appropriate fastening members, the waterproof washer will be pushed by the cover and abut against the slant inner edge, and thereby achieve the seal between the cover and the housing.

15 Claims, 5 Drawing Sheets

WATERPROOF CASE

FIELD OF THE INVENTION

The present invention relates to a waterproof case, and in particular, to a waterproof case for receiving a control circuit board and preventing the circuit board from being damaged by humidity due to water leakage.

BACKGROUND OF THE INVENTION

Most electrical appliances have adopted electronic circuits for controlling the appliances as a result of the development of science and technology. Such electronic circuit is usually designed to include a type of electronic circuit board, and the electronic components on the circuit board, such as resistors, capacitors, transistors, and integrated components etc., can be normally operated only under waterproof conditions. Moreover due to the requirement for operation, the electronic circuit for controlling is usually provided at the exterior of the electrical appliance and thus is liable to contact with water and be damaged by the humidity. For example, the control circuit of outdoor Christmas lamps is usually placed in an environment of low temperature and humidity, and such a circuit needs a special design to avoid damage caused by the humidity. Therefore, how to prevent an electronic circuit from being damaged by humidity is an important countermeasure to be considered in designing electronic appliances.

DESCRIPTION OF THE PRIOR ART

Generally, a control circuit board is received in a container, and the output and input lines thereof are directed to the exterior of the body of the electrical appliance. This container should be provided with protection functions, such as anti-impacting and humidity-proof functions.

Taiwan (ROC) Utility Model Publication No. 243794 disclosed a waterproof case for an alarm device of automobiles and motorcycles, mainly comprising a rectangular plastic case body, a circuit board, connecting terminals and a case cover, wherein AB resin seal gum is injected into a groove around the exit of the connecting terminals and an outer edge groove formed between the case body and case cover, in order to obtain waterproof function. However, in this waterproof case structure, since resin is used to seal the slit between the case body and the case cover, after the sealing, it is difficult to disassemble and reassemble this case structure, and thus this case is disadvantageous for the replacement and maintenance of components.

Taiwan (ROC) Utility Model Publication No. 290019 disclosed an improvement of a waterproof case, mainly comprising a case body, a case cover and an anti-leaking pad, in which the anti-leaking pad is provided in the groove extending outwardly from the outer edge of the opening of the case body, and the case cover is attached to the anti-leaking pad in order to cover the opening of the case body. The outer side of the anti-leaking pad is formed into an annular depression, which will generate a sucking disk effect when pushed by the case cover, and thus will attach to the inner wall of the case cover in order to obtain the waterproof effect. However, in view of the low machining accuracy of the anti-leaking pad and the inappropriate deformation of the depression under a load-bearing condition, the anti-leaking pad is liable to lose its expected sucking effect and thus cannot achieve the waterproof function.

SUMMARY OF THE INVENTION

Accordingly, it is an object of the present invention to provide a waterproof case, which is used to receive a circuit board and can prevent water from entering the receiving space of the case.

It is another object of the present invention to provide an improved waterproof case, which facilitates the replacement and maintenance of the components.

It is still another object of the present invention to provide an improved waterproof case, which can achieve high machining accuracy.

For achieving the aforesaid objects, the waterproof case of the present invention provides an improved structure for receiving a circuit board in a sealed and waterproof receiving space, which comprises:

a housing, of which the inner edge of an open end is formed into a slant inner edge, and a closed end is provided with supporting members for supporting the circuit board received in the housing;

a cover, which is attached to the open end of the housing, and of which one side attached to the housing is provided with an annular flange that is of a stepped shape with a higher inner portion and a lower outer portion; the side thereof having the flange is further provided with mounting members for mounting the circuit board; and the cover having a through hole for passing the wires of the circuit board and a mounting hole for mounting a control switch; and a waterproof washer, being mounted and fixed onto the flange of the cover, and abutting against the slant inner edge of the open end of the housing.

When fixing the cover onto the housing by means of appropriate fastening members, the waterproof washer will be pushed by the cover and thus abut against the slant inner edge of the housing, and thereby achieve a sealing between the cover and the housing.

BRIEF DESCRIPTION OF THE DRAWINGS

These and other attributes of the present invention will become clear upon a thorough study of the following description of the preferred embodiment for carrying out the invention, particularly when reviewed in conjunction with the drawings, wherein.

DETAILED DESCRIPTION OF THE INVENTION

Figure 1:
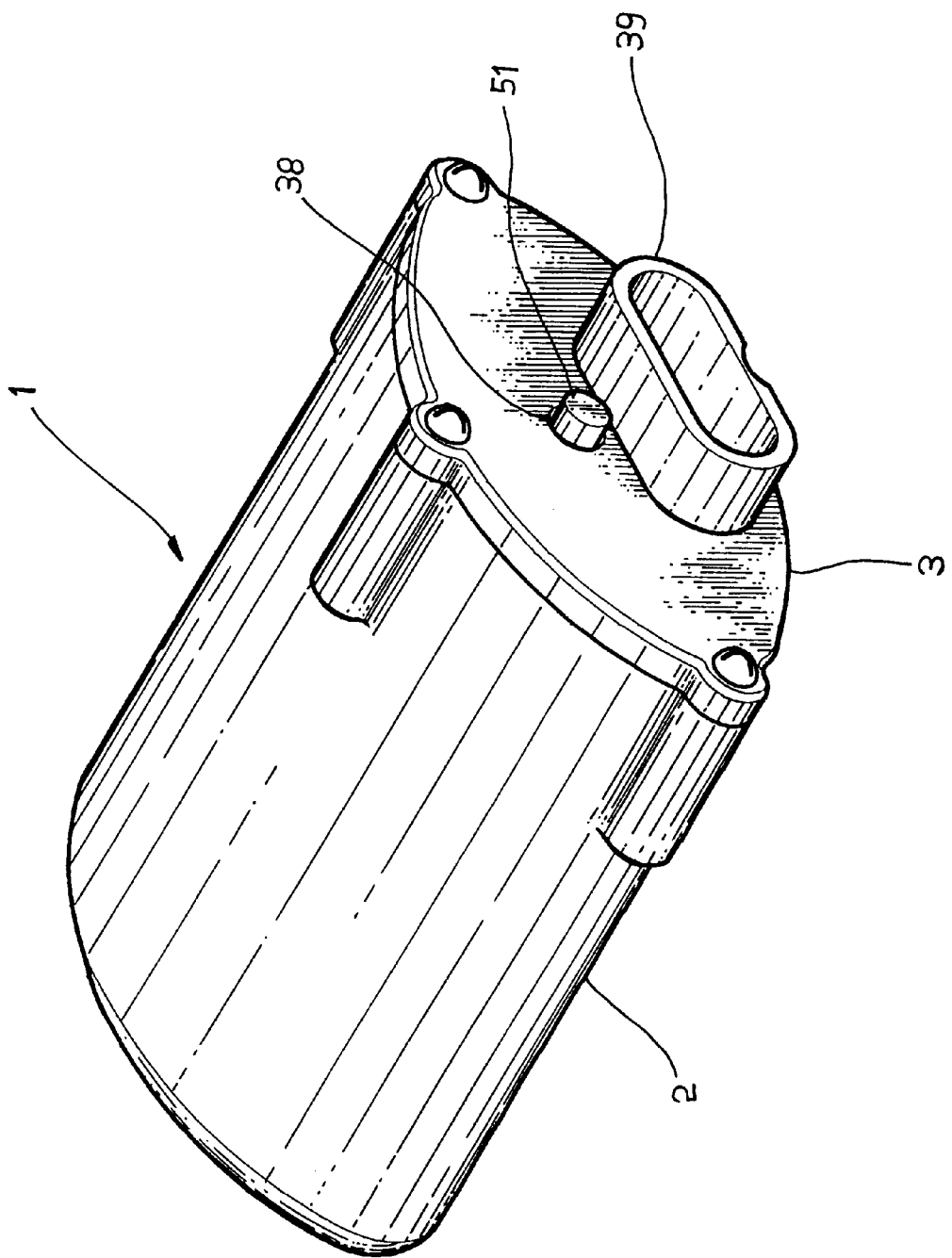
FIG. 1 is a perspective view of a waterproof case in accordance with the present invention.
Figure 2:
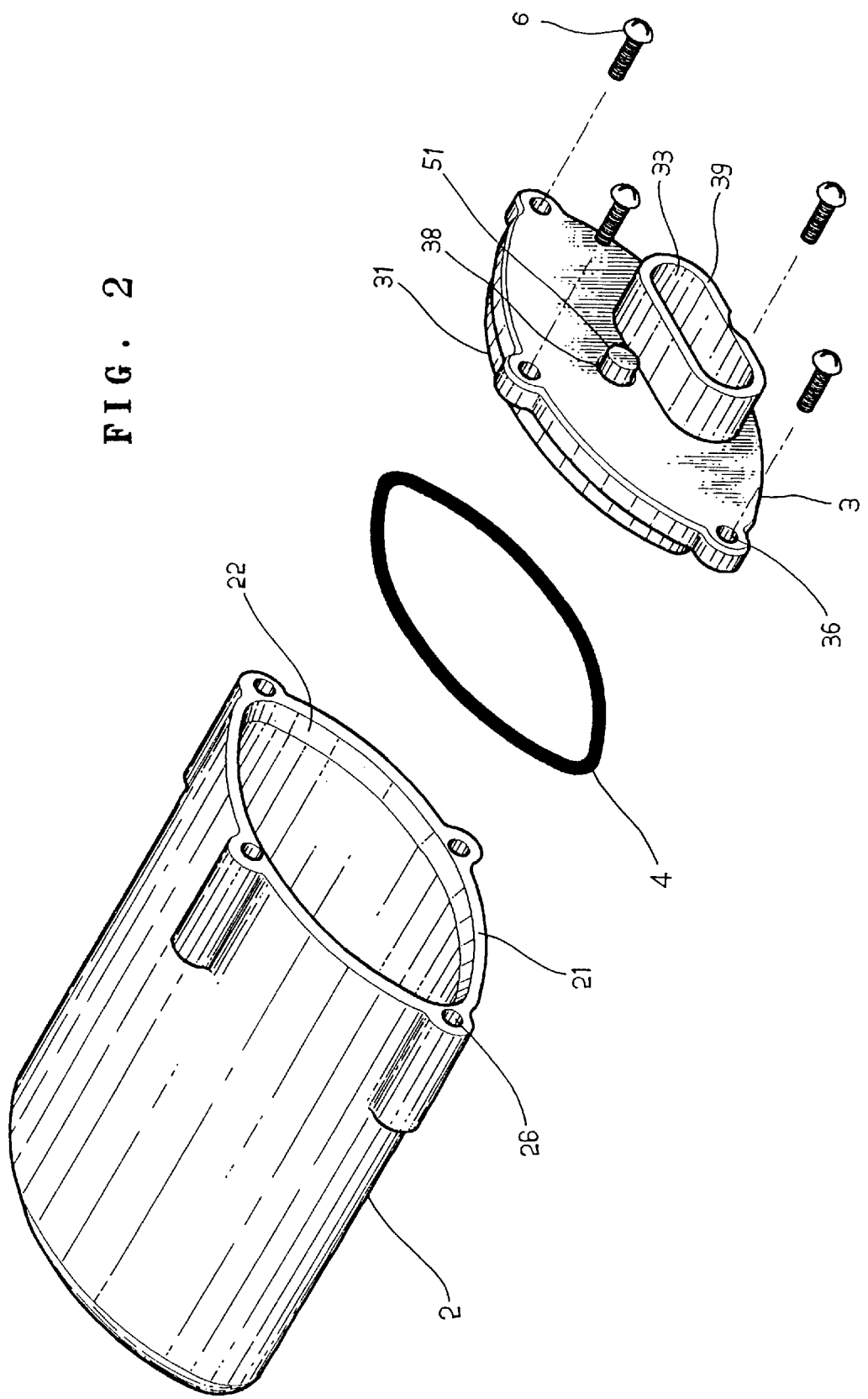
FIG. 2 is an exploded perspective view of a waterproof case in accordance with the present invention.

Please refer to FIGS. 1 and 2. The waterproof case 1 of the present invention mainly comprises a housing 2, a cover 3 and a waterproof washer 4, in which the cover 3 is attached to the open end 21 of the housing 2, and the waterproof washer 4 is placed between the housing 2 and the cover 3.

Figure 6:
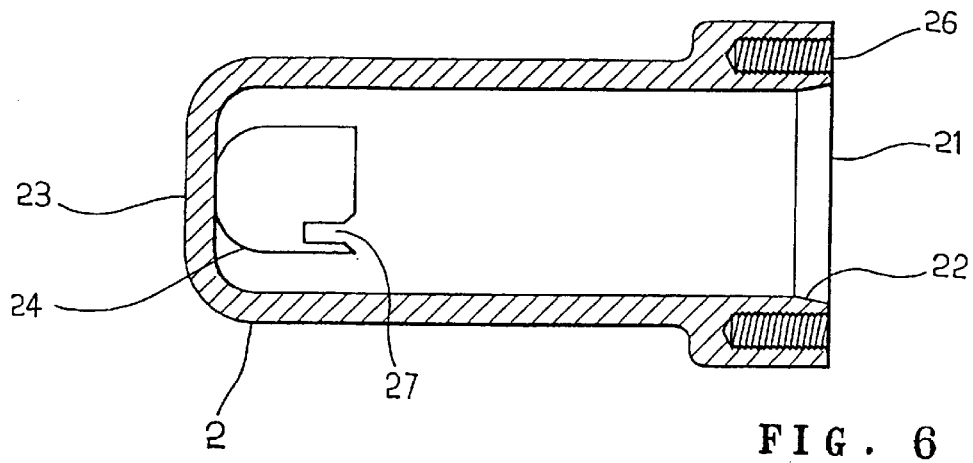
FIG. 6 is a schematic sectional view showing the housing of the waterproof case of the present invention.
Figure 7:
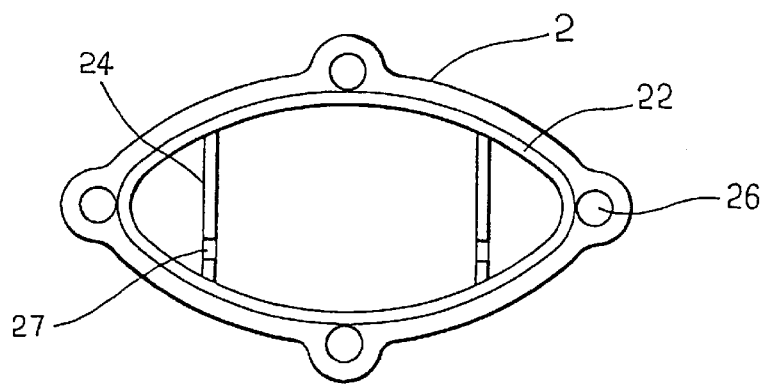
FIG. 7 is a front view showing the housing of the waterproof case of the present invention.
Figure 8:
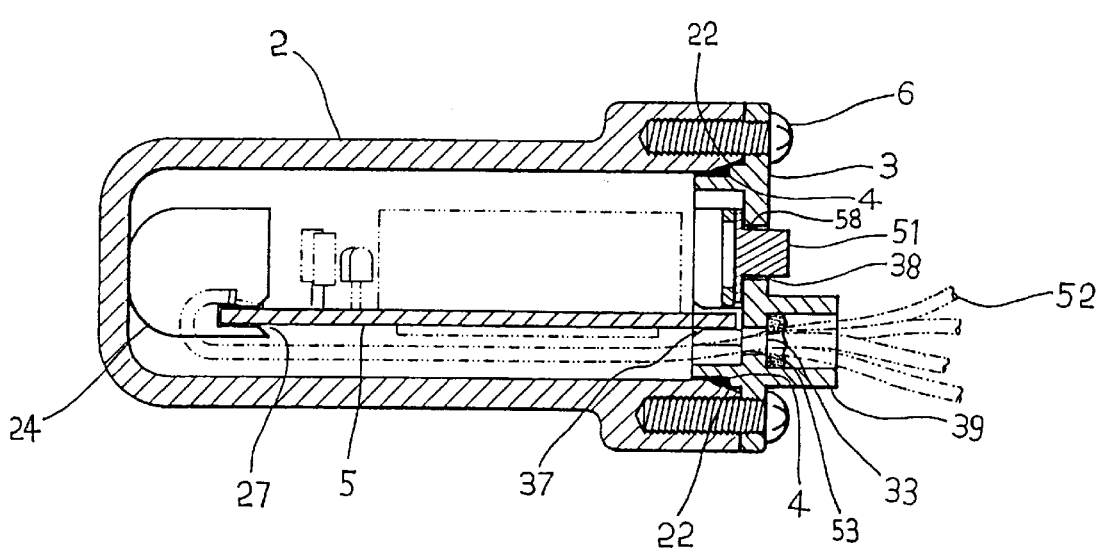
FIG. 8 is a schematic sectional view of the waterproof case of the present invention.
Figure 9:
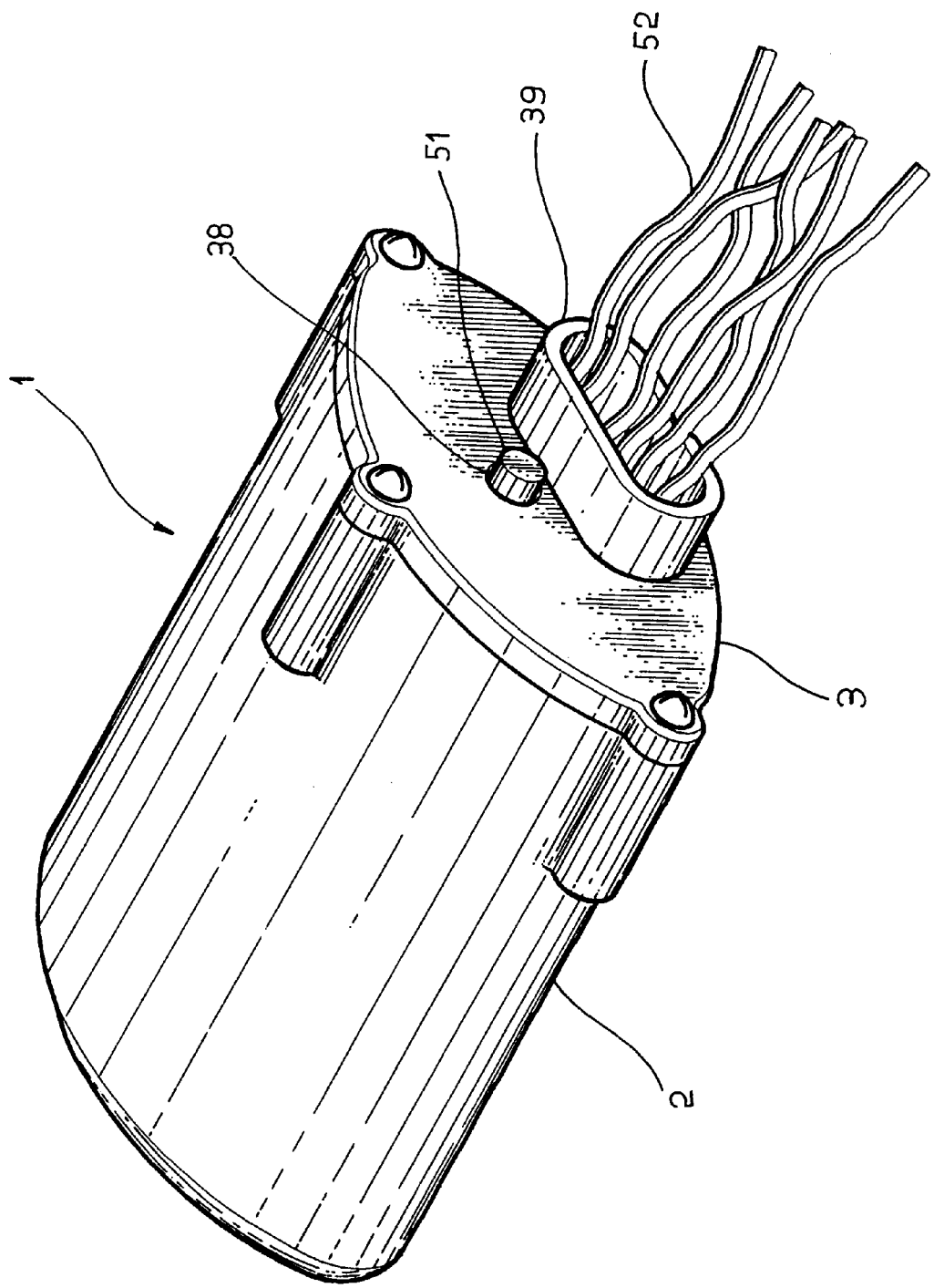
FIG. 9 is a perspective view of the waterproof case of the present invention in use.

The housing 2 is a container having an open end 21, of which the inner edge is formed into a slant inner edge 22 slanting radially and inwardly, and a closed end 23 opposite to the open end 21 is provided with supporting members 24 for supporting a circuit board 5 received in the housing 2, as shown in FIGS. 6–8.

Figure 3:
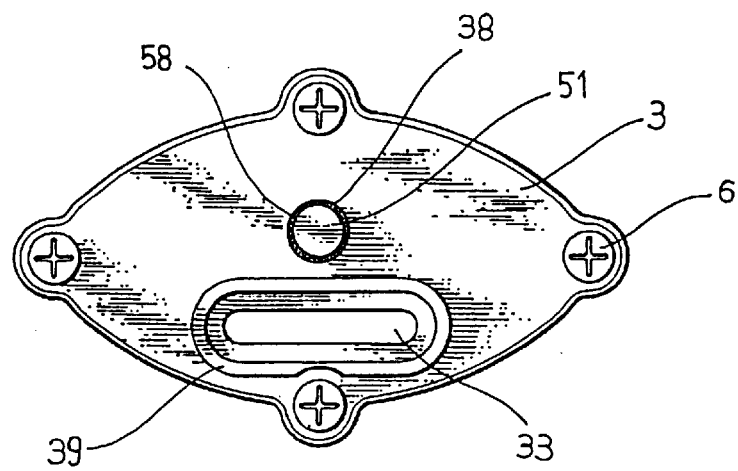
FIG. 3 is a front view of the waterproof case of the present invention.
Figure 4:
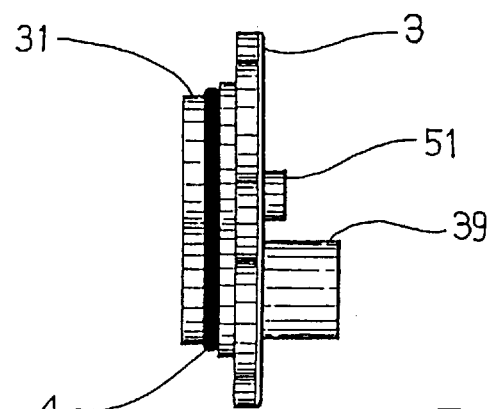
FIG. 4 is a side view showing the cover of the waterproof case of the present invention.
Figure 5:
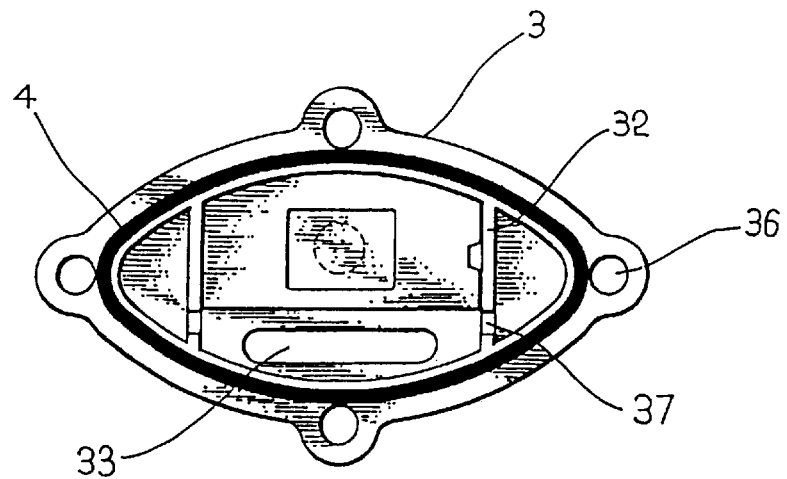
FIG. 5 is a rear view of the cover of the waterproof case of the present invention.

The shape of the cover 3 corresponds to that of the open end 21 of the housing 2, and one side of the cover 3 attached to the housing 2 has an annular flange 31, as shown in FIGS. 2 and 4. The shape and size of the flange 31 correspond to those of the slant inner edge 22 of the open end 21 of the housing 2, and the flange 31 is of a stepped shape with a higher inner portion and a lower outer portion, as shown in FIG. 4. At the side of the cover 3 attached to the housing 2, mounting members 32 are provided for mounting the circuit board 5 (as shown in FIG. 5), and their positions correspond to those of the supporting members 24 in the closed end 23 of the housing 2. The cover 3 has a through hole 33 for the passing of the wires 52 of the circuit board 5, as shown in FIGS. 2, 3, 5 and 8.

The waterproof washer 4 is usually made of resilient material, such as rubber, and is mounted and fixed on the stepped flange 31 of the cover 3, as shown in FIGS. 4 and 5, and abuts against the slant inner edge 22 of the housing 2, as shown in FIG. 8.

As shown in FIGS. 1 and 2, the outer edges of the open end 21 of the housing 2 and of the cover 3 are provided with at least two (four in the drawings) symmetrically and correspondingly arranged threaded holes 26 and 36, and screws 6 are used as fastening members for fixing the cover 3 onto the housing 2. At this time, the waterproof washer 4 is pushed by the cover 3 and abuts against the slant inner edge 22 of the housing 2 in order to achieve the sealing effect, as shown in FIG. 8. In view of the radially and inwardly slanting inner edge 22, the pushed waterproof washer 4 will abut against the slant inner edge 22 and contract inwardly, and thereby achieve a better sealing effect when being compared with the prior art.

As shown in FIGS. 5–8, the supporting members 24 of the housing 2 and the mounting members 32 of the cover 3 are of sheet shape and perpendicular to the circuit board 5. In the embodiment shown in the drawings, the housing 2 has two sheet-shaped supporting members 24 and the cover 3 has two sheet-shaped mounting members 32. The supporting members 24 and mounting members 32 have cutouts 27 and 37, respectively, for the insertion of the circuit board 5, as shown in FIGS. 5–7. The cutouts 27 and 37 are placed on the same plane such that the circuit board 5 can be securely received in the waterproof case 1, as shown in FIG. 8.

Further, as shown in FIGS. 1–4, 8 and 9, depending on the need of the control circuit of the circuit board 5, the cover 3 can be provided with a mounting hole 38 for mounting a control switch 51 of the circuit board 5. Moreover, in the cover 3, the outer side of the through hole 33 for wires is provided with an annular wall 39 in order to wrap the bundle of wires 52 of the circuit board 5.

Furthermore, to increase the waterproof effect of the waterproof case 1, people can optionally fill resin waterproof material 53 and 58 or other waterproof material into the through hole 33 having the wires 52 passing therethrough and the mounting hole 38 having the control switch 51 therein to form a waterproof structure, as shown in FIGS. 3 and 8.

The invention may be embodied in other specific forms without departing from the spirit or other characteristics thereof. The present embodiment is, therefore, to be considered as illustrative and not restrictive. The scope of the invention is indicated by the appended claims rather than by the foregoing description, and all changes which come within the meaning and range of equivalency of the claims are, therefore, intended to be embraced therein.

What is claimed is:

1. A waterproof case for receiving a circuit board, comprising:

a housing including a container having an open end and a closed end opposite to the open end, wherein an inner edge of the open end is formed with a slanted inner edge slanting radially and inwardly, and wherein the housing has two supporting members at the closed end for supporting a circuit board received in the housing;

a cover attached to the open end of the housing, wherein a shape of the cover corresponds to a shape of the open end of the housing, wherein a first side of the cover includes an annular flange having a shape and a size to correspond to a shape and a size of the slanted inner edge of the open end of the housing, the flange having a higher inner portion and a lower outer portion, and wherein the first side of the cover has two mounting members positioned to correspond to the respective two supporting members of the closed end of the housing for mounting the circuit board, wherein the two supporting members of the housing and the two mounting members of the cover each have a cutout for receiving a circuit board, such that each cutout of the supporting members is positioned on a common plane with a corresponding and respective cutout of the mounting members, and wherein the cover includes a through hole through which wires of the circuit board pass; and a waterproof washer mounted and fixed onto the flange of the cover, and abutting against the slanted inner edge of the open end of the housing;

wherein when the cover is fixed onto the housing by means of fastening members, the waterproof washer is pushed by the cover and abuts against the slanted inner edge, thereby achieving a sealing effect.

2. A waterproof case as claimed in claim 1, wherein the fastening members for connecting the cover with the housing are screws.

3. A waterproof case as claimed in claim 1, wherein an outer edge of the open end of the housing and an outer edge of the cover are provided with at least two symmetrically and correspondingly arranged threaded holes for receiving screws to connect the housing with the cover.

4. A waterproof case as claimed in claim 1, wherein an annular wall is provided at an outer side of the through hole of the cover to receive the wires of the circuit board.

5. A waterproof case as claimed in claim 1, wherein the housing and the cover are each integrally made of engineering plastic.

6. A waterproof case as claimed in claim 1, wherein the waterproof washer is made of a resilient material.

7. A waterproof case as claimed in claim 1, wherein the cover has a mounting hole for mounting a control switch of the circuit board.

8. A waterproof case as claimed in claim 1, wherein resin waterproof material is injected into the through hole for receiving the wires of the circuit board.

9. A waterproof case for receiving a circuit board, comprising:

a housing including a container having an open end and a closed end opposite to the open end, wherein an inner edge of the open end is formed with a slanted inner edge slanting radially and inwardly, and wherein the closed end is provided with supporting members for supporting a circuit board received in the housing;

a cover attached to the open end of the housing, wherein a shape of the cover corresponds to a shape of the open end of the housing, wherein a first side of the cover, includes an annular flange having a shape and size corresponding to a shape and size of the slanted inner edge of the open end of the housing, the flange having a higher inner portion and a lower outer portion, wherein the first side of the cover includes mounting members located at positions so as to correspond to the respective supporting members of the closed end of the housing, the mounting members provided for mounting a circuit board, wherein the cover includes a through hole through which wires of the circuit board pass, wherein the cover includes a mounting hole for mounting a control switch of the circuit board, and wherein resin waterproof material is injected into the mounting hole having the control switch of the circuit board received therein; and a waterproof washer mounted and fixed onto the flange of the cover, and abutting against the slanted inner edge of the open end of the housing;

wherein when the cover is fixed onto the housing by means of fastening members, the waterproof washer is pushed by the cover and abuts against the slanted inner edge, thereby achieving a sealing effect.

10. A waterproof case as claimed in claim 9, wherein the fastening members for connecting the cover with the housing are screws.

11. A waterproof case as claimed in claim 9, wherein an outer edge of the open end of the housing and an outer edge of the cover are provided with at least two symmetrically and correspondingly arranged threaded holes for receiving screws to connect the housing with the cover.

12. A waterproof case as claimed in claim 9, wherein an annular wall is provided at an outer side of the through hole of the cover to receive the wires of the circuit board.

13. A waterproof case as claimed in claim 9, wherein the housing and the cover are each integrally made of engineering plastic.

14. A waterproof case as claimed in claim 9, wherein the waterproof washer is made of a resilient material.

15. A waterproof case as claimed in claim 9, wherein resin waterproof material is injected into the through hole having the wires of the circuit board passing therethrough.

* * * * *